United States Patent
Ouellet et al.

[19]

[11] Patent Number: 6,127,266

[45] Date of Patent: Oct. 3, 2000

[54] STABILIZATION OF THE INTERFACE BETWEEN TIN AND Al ALLOYS

[75] Inventors: Luc Ouellet, Granby; Yves Tremblay, Bromont 2; Luc Gendron, Canton de Shefford, all of Canada

[73] Assignee: Mitel Corporation, Kanata, Canada

[21] Appl. No.: 08/979,956

[22] Filed: Nov. 26, 1997

[30] Foreign Application Priority Data

Nov. 26, 1996 [CA] Canada ................................ 2191260

[51] Int. Cl.[7] ............................................... H01L 21/4763

[52] U.S. Cl. .................... 438/643; 438/648; 438/656; 438/660; 438/663

[58] Field of Search ............................... 438/624, 627, 438/635, 648, 656, 660, 663, 685, 643

[56] References Cited

U.S. PATENT DOCUMENTS

| | | |
|---|---|---|
| 5,232,871 | 8/1993 | Huei-Min . |
| 5,747,361 | 5/1998 | Ouellet .................... 438/660 |
| 5,895,266 | 2/1996 | Fu et al. .................... 438/648 |

FOREIGN PATENT DOCUMENTS

| | | |
|---|---|---|
| 0 680 077 | 11/1995 | European Pat. Off. . |
| 0 738 002 | 10/1996 | European Pat. Off. . |
| 0 776 033 | 5/1997 | European Pat. Off. . |
| 0 791 663 | 8/1997 | European Pat. Off. . |

OTHER PUBLICATIONS

Dixit G A et al: "Reactively Sputtered Titanium Nitride Films for Submicron Contact Barrier Metallization" Applied Physics Letters, vol. 62, No. 4, Jan. 25, 1993, pp. 357–359, XP000335994 see whole document relevant to Claim 1, 10, 12.

Patent Abstracts of Japan vol. 096, No. 009, Sep. 30, 1996 & JP 08 130302 A (Toshiba Corp.) May 21, 1996 see Abstract.

*Primary Examiner*—David Nelms
*Assistant Examiner*—Reneé R. Berry
*Attorney, Agent, or Firm*—Marks & Clerk

[57] ABSTRACT

A method of manufacturing a semiconductor device which includes an interface between a metal layer and a barrier layer of a nitride of a refractory metal, comprising the steps of depositing the barrier layer onto a wafer at high temperature; subjecting the barrier layer to a mixture of oxygen or an oxygen-containing gas and an inert gas in the presence of a plasma at low pressure and for a time sufficient to oxidize the surface of the barrier layer; removing the oxygen-containing gas; and depositing the metal layer onto the oxidized surface without subjecting said wafer to an air break. The method permits high throughput to be achieved at low cost.

8 Claims, 11 Drawing Sheets

STABILIZATION OF THE INTERFACE
BETWEEN TIN AND A1 ALLOYS

FIELD OF THE INVENTION

This invention relates to a method and apparatus for stabilizing the interface between a barrier layer and a metal, such as between TiN and Al alloys, so as to prevent the interaction of these materials at high temperatures.

BACKGROUND OF THE INVENTION

TiN/Al alloy interfaces occur in the manufacture of semiconductor devices, where TiN may typically be used as a barrier layer to prevent the migration of Al into an adjacent layer. Such interfaces tend to break down at the high temperatures to which semiconductors are subjected and some means of stabilizing the interface is essential. It is known that oxygen can be used to stabilize the interface.

One technique used for the oxidation of the TiN surface prior to the deposition of an Al alloy is the air break technique (with or without a furnace anneal): This technique involves coating a cassette of wafers with TiN in a vacuum processing apparatus, venting the cassette of TiN coated wafers to air, loading the TiN coated wafers from ambient air to an "ex-situ" furnace (optional), annealing the TiN coated wafers in $N_2$ at atmospheric pressure and at about 425° C. for about 30 minutes (the $N_2$ typically carries about 1 ppm of $O_2$ impurity representing a partial pressure of about $7.6 \times 10^{-3}$ Torr of $O_2$) (optional), unloading the oxidized TiN coated wafers in ambient air ($O_2$ partial pressure of 150 Torr) (optional), reloading the oxidized TiN coated wafers in the Al alloy deposition equipment, and degassing the oxidized TiN coated wafers at about 450° C. for about 60 seconds.

In this particular case, the oxidation of the TiN layer occurs mainly during the air exposure (150 Torr $O_2$ at 25° C. for a duration of 60 minutes); the ambient air loading of the wafers into the furnace (150 Torr $O_2$ from 25° C. to 425° C. for a duration of about 5 minutes); the $N_2$ anneal into the furnace (7.6E-3 Torr $O_2$ at 425° C. and for a duration of about 30 minutes); and the ambient air unloading of the wafers (150 Torr $O_2$ from 425° C. to 25° C. and for a duration of about 15 minutes).

Many manufacturers of integrated circuits use this air break technique and a furnace anneal. This technique cannot provide the high throughput and low cost process required for TiN and Al alloy depositions in commercial devices.

The oxidation can also be performed by exposing (one by one and for about 60 seconds) the TiN coated wafers to an "ex-situ" Rapid Thermal Processor (RTP) at atmospheric pressure at about 550 to 750° C. in $N_2$ (with typically 1 ppm of $O_2$), $NH_3$ (with typically 1 ppm of $O_2$) or mixtures of one of these gases with some $O_2$ before reloading the wafers in the Al deposition equipment. In this particular case, the oxidation of the TiN layer mainly occurs during the anneal into the RTP furnace ($7.6 \times 10^{-3}$ Torr $O_2$ at 550 to 750° C. and for a duration of about 60 seconds); and the ambient air cooling of the wafers (150 Torr $O_2$ from 400° C. to 25° C. and for a duration of about 60 seconds).

While many manufacturers use this air break and RTP anneal technique in a production setting, it cannot provide the high throughput and low cost process required for the integration of TiN and Al alloy depositions.

The oxidation can also be performed by exposing (one by one and for about 60 seconds) the TiN coated wafers to an integrated RTP providing an "in-situ" oxidation of the TiN layer at about 550 to 750° C. using about 5 to 20 mTorr of $O_2$. The use of an integrated RTP module allows the high throughput and low cost process by integrating the deposition of TiN, the oxidation of TiN and the deposition of Al alloys in a single pump-down of a cluster tool. This technique has nevertheless two drawbacks. Firstly, when used at the high end of the temperature range, for example between 650 and 750° C., $TiSi_2$ is formed at the bottom of the contact by consumption of a thick layer of substrate Si. This situation is not very desirable for advanced semiconductor devices which use shallow junctions into substrate Si. Secondly, when used in the low end of the temperature range, for example between 550 and 650° C., TiSi is formed and a smaller amount of Si is consumed, thus removing the first limitation. These temperatures are still high enough to cause a very thick oxidation (consumption) of the TiN layer within this 60 seconds duration. In other words, the low temperature RTP oxidation process allows too deep an oxygen penetration into the TiN layer.

It has been shown that the deeper the oxidation of the TiN layer, the deeper the penetration of the Al into the oxidized TiN during post Al deposition heat treatments. In order to prevent the complete oxidation (consumption) of the TiN layer, a very thick layer of TiN is required at the bottom of deep and small diameter contact holes. This requirement is very difficult to achieve, if not impossible, for contact holes of ever decreasing diameters.

The oxidation could also be performed by exposing (one by one and for about 60 seconds) the TiN layer to an "in-" $O_2$ plasma at low temperature (for example, less than 450° C.) prior to the deposition of Al alloys. The low temperature oxidation associated with $O_2$ plasma would give a thin oxidation of TiN layers and would permit shallower TiN layers at the bottom of these small diameter contact holes. The use of an integrated $O_2$ plasma would also provide the high throughput and low cost process by integrating the deposition of TiN, the oxidation of TiN and the deposition of Al alloys in a single pump-down of a cluster tool.

The above technique has two major drawbacks. Firstly, there would be serious hazard problems associated with pure $O_2$ plasmas. Pure $O_2$ plasmas result in the formation of large quantity of ozone, $O_3$, a toxic gas. The pumping of large quantity of ozone with cryopumps results in the liquefaction of ozone which can suddenly explode when the toxic liquid drops onto warmer walls of the cryopump. The pumping of oxygen in large quantity results in a big block of frozen oxygen into the cryopump which may result in a very dangerous explosive gas mixture during power failures. The pumping of oxygen in large quantity results in critical regeneration of the cryopumps and special safety devices are required to prevent fire and explosions. Ion gauges are sources of ignition and explosion in pure $O_2$ gases. Secondly, the pumping of pure $O_2$ gas, from about 5 mTorr of $O_2$ to a partial pressure of about $5 \times 10^{-8}$ Torr of $O_2$, is required after the completion of the plasma treatment and before the opening of the isolation gate valve of the process module to the wafer transfer module. The duration of this pump-down to a low enough $O_2$ partial pressure would be too long and would be a throughput limiter for the cluster tool.

An object of the invention is to alleviate the aforementioned problems of the prior art.

SUMMARY OF THE INVENTION

According to the present invention there is provided a method of manufacturing a semiconductor device which includes an interface between a metal layer and a barrier layer of a nitride of a refractory metal, comprising the steps of depositing the barrier layer onto a wafer at high temperature; subjecting the barrier layer to a mixture of oxygen or an oxygen-containing gas and an inert gas in the presence of a plasma at low pressure and for a time sufficient to oxidize the surface of the barrier layer; removing said oxygen-containing gas; and depositing said metal layer onto said oxidized surface without subjecting said wafer to an air break. The wafer is typically cooled to room temperature prior to being subjected to the plasma.

The oxygen-containing gas may pure $O_2$. The inert gas may be argon. The partial pressure of oxygen is typically in the range of about $10^{-4}$–$10^{-6}$ Torr, with a partial pressure of oxygen of about $10^{-5}$ Torr generally being preferred.

The invention allows the safe integration of a low temperature and high performance oxidation of the interface between TiN and Al alloys in a cluster tool.

This invention thus describes an improved way of stabilizing the interface between, for example, TiN and Al alloys by using an in-situ diluted plasma, for example, $(Ar+O_2)$ between the TiN deposition and the Al alloy deposition without an air break between TiN deposition and Al alloy deposition.

BRIEF DESCRIPTION OF THE DRAWINGS

The invention will now be described in more detail, by way of example, only with reference to the accompanying drawings, in which.

DESCRIPTION OF THE PREFERRED EMBODIMENTS

Figure 1:
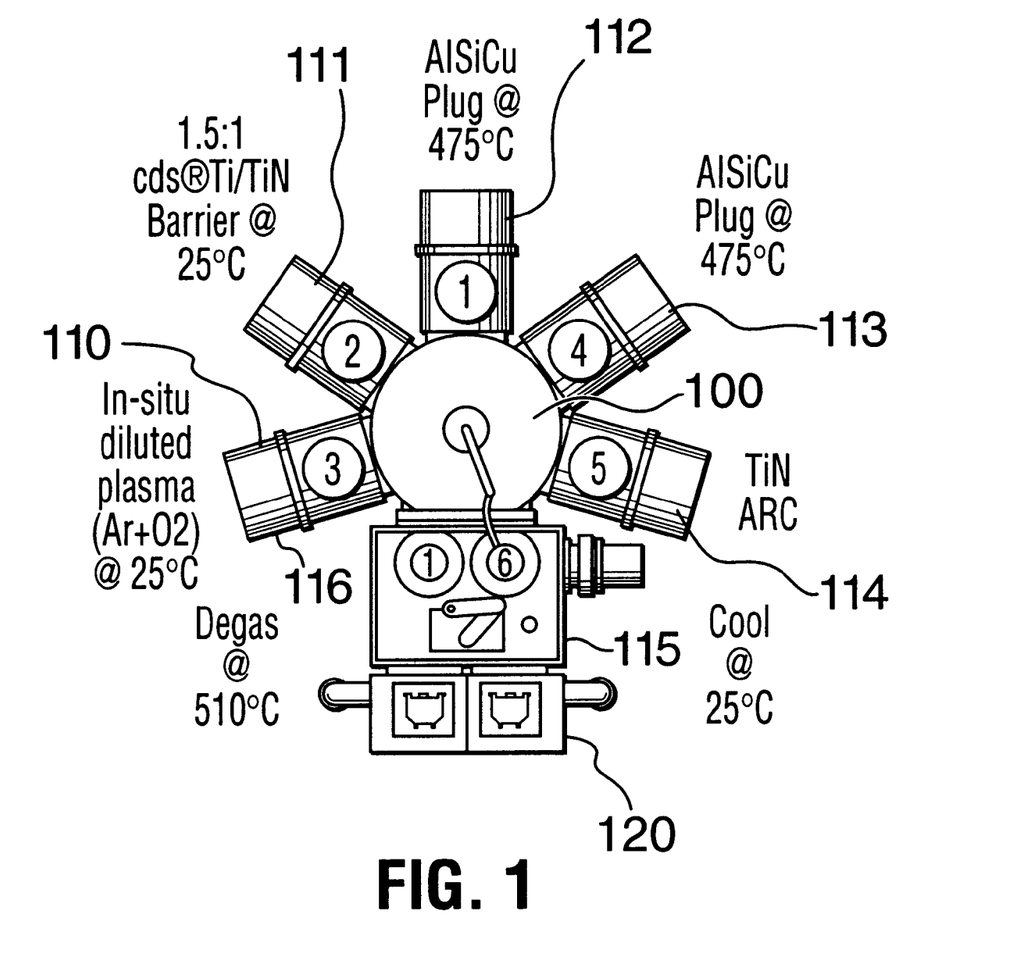
FIG. 1 shows a cluster tool suitable for practicing a method in accordance with he invention.

FIG. 1 shows a typical M2000 cluster tool suitable for practicing the invention. It comprises a transfer chamber 100, a series of processing stations 110 to 115, and a cryopump 112. With the exception of the addition of an extra argon line, the cluster tool is conventional and its construction will be familiar to one skilled in the art.

EXAMPLE

The cluster tool was used for the in-situ diluted $(Ar+O_2)$ plasma oxidation of a TiN layer prior to the integrated deposition of plugs of Al alloys. The wafers were processed as follows. First a wafer was transferred from the cassette to the degas station 115 for single wafer degassing at high temperature, in this example 510° C. (STEP 1).

Next, the wafer was transferred from the degas station 115 to the Ti/TiN deposition module 111 for deposition of the Ti/TiN barrier onto the hot wafer (STEP 2). The hot wafer was then covered with a top TiN layer from the Ti/TiN deposition module 111 in a conventional ME (magnetically enhanced RF plasma) etch module 110 equipped with standard Ar gas lines and a special diluted (Ar+O2) gas line 116 for the subsequent in-situ diluted $(Ar+O_2)$ plasma process (STEP 3). The residual pressure of the module 110 at this point was about $2\times10^{-8}$ Torr and the partial residual pressure of $O_2$ (or oxygen containing species, such as $H_2O$ and $CO_2$) was about $5\times10^{-9}$ Torr;

About five seconds after the closure of the gate valve the (100% Ar) back-side gas was turned on to build up a pressure of 2.0 mTorr of Ar in the chamber within about 3 seconds. This back-side Ar was used to cool the wafer from about 400° C. to about room temperature while carrying out the oxidation process. Then, a diluted $(Ar+O_2)$ gas mixture was allowed into the chamber in order to build up a total pressure of 7 mTorr within about 3 seconds. The entire process was repeated using different ratios of argon to oxygen. The diluted $(Ar+O_2)$ gas mixture had the following composition during different runs:

(100.0% Ar–0.0% $O_2$) giving a partial pressure of $O_2$ of about $5\times10^{-9}$ Torr (99.9% Ar–0.1% $O_2$) giving a partial pressure of $O_2$ of about $5\times10^{-6}$ Torr (99.0% Ar–1.0% $O_2$) giving a partial pressure of $O_2$ of about $5\times10^{-5}$ Torr (90.0% Ar–10.0% $O_2$) giving a partial pressure of $O_2$ of about $5\times10^{-4}$ Torr (0.0% Ar–100.0% $O_2$) giving a partial pressure of $O_2$ of about 7 mTorr The plasma was struck using a 13.56 MHz power supply for a duration of 60 seconds at 250 W. The plasma, the diluted $(Ar+O_2)$ gas, and the back-side gas were turned off. The cryopump then quickly eliminated the partial pressure of $O_2$ in about 10 seconds to a partial pressure lower than $5\times10^{-8}$ Torr.

The gate valve was opened for wafer removal from the process station to the transfer module. The wafer was transferred from the ME Etch module 110 to one of the two Al deposition modules 112, 113 for the deposition of an AlSiCu plug at relatively high temperature (STEP 4);

The wafer was transferred from the Al deposition module to the TiN ARC (anti-reflective coating) deposition module 114 for the deposition of a TiN ARC layer (STEP 5). The wafer was transferred from the TiN ARC deposition module to the cool station for wafer cooling to about room temperature (STEP 6). Finally, the wafer was transferred from the cool station to the cassette.

The above sequence allows the integrated oxidation of the TiN layer prior to the deposition of plugs of Al alloys and permits this advanced metallization sequence to be performed at high throughput, without any air break and at very low cost.

The attached graphs in FIGS. 2 to 11 show by way of comparison the results of the different processes described above with the standard air break technique as a reference.

It will be seen in the attached graphs that an air exposure of the TiN layer for a duration of one hour gives good results, and in particular:

1) Very good $N^+P^-$ junction leakage results and high yield during post deposition heat treatments;

2) Low and stable average contact chain resistance to poly 1, poly 2, $N^+$ and $P^+$ during heat treatments;

3) Low and stable standard deviation of contact chain resistance to poly 1, poly2, N+ and P+ during heat treatments;

When the TiN layer is processed using an "in-situ" plasma in pure Ar with only about $5\times10^{-9}$ Torr of $O_2$, very serious problems occur, such as very serious $N^+P^-$ junction leakage problems and yield loss during post deposition heat treatments, and serious P+N− junction leakage problems and yield loss during post deposition heat treatments;

At the other extreme, plasma treatment of the TiN layer in pure $O_2$ causes another set of very serious problems, in particular very high and very unstable average contact chain resistance to poly 1, poly 2, $N^+$ and $P^+$ during heat treatment, and very high and unstable standard deviation of contact chain resistance to poly-1, polly-2, $N^+$ and $P^+$ during heat treatment;

The attached graphs demonstrate show that there is a range of partial pressures of $O_2$ in which, surprisingly, good results can be obtained:

A partial pressure between $5\times10^{-6}$ Torr and $5\times10^{-4}$ Torr is suitable for the stabilization of $N^+P^-$ and $P^+N^-$ junction leakage during heat treatments. A partial pressure between; $5\times10^{-6}$ Torr and $5\times10^{-4}$ Torr is suitable for the reduction and the stabilization of the average contact chain resistance to poly 1, poly 2, N+ and P+ during heat treatments. A partial pressure between $5\times10^{-6}$ Torr and $5\times10^{-4}$ Torr is suitable for the reduction and the stabilization of the standard deviation of the contact chain resistance to poly-1, poly-2, N+ and P+ during heat treatments.

A partial pressure of $5\times10^{-5}$ Torr gives a very robust process and is low enough to give no concern about safety issues with cryopumps.

When compared to the standard air break and one hour air exposure process, the optimum 'in-situ" diluted (Ar+$O_2$) plasma treatment of the of the TiN layer maintains slightly higher junction leakage yields during heat treatments, maintains as low and as stable average contact chain resistance to poly 1, poly 2, $N^+$ and $P^+$ during heat treatments, and maintains as low and as stable standard deviation of contact chain resistance to poly 1, poly2, $N^+$ and $P^+$ during heat treatments.

Figure 2:
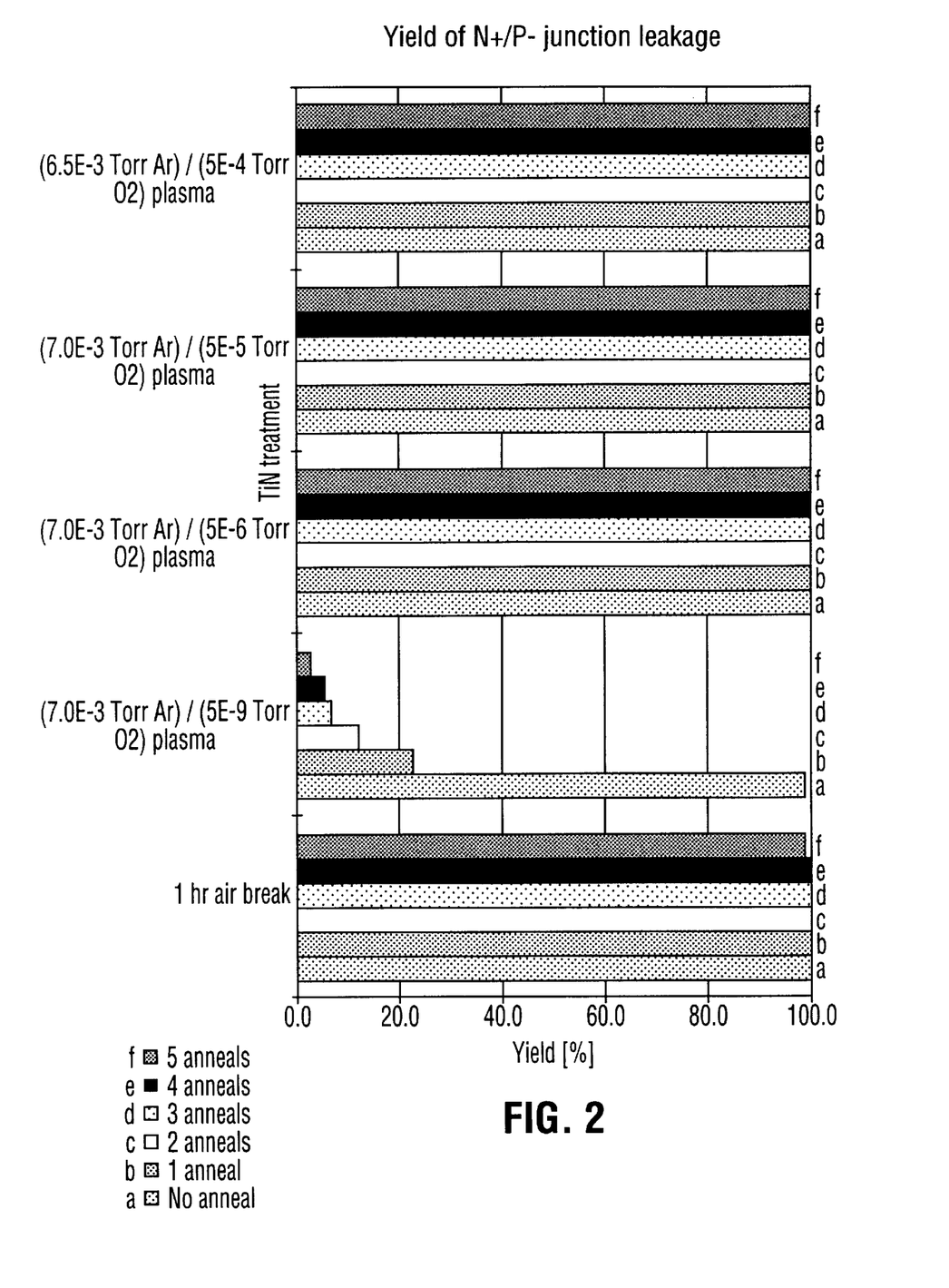
FIG. 2 is comparison chart showing the yield of $N^+/P^-$ junction leakage for different partial pressures of oxygen and using the air break technique of the prior art.
Figure 3:
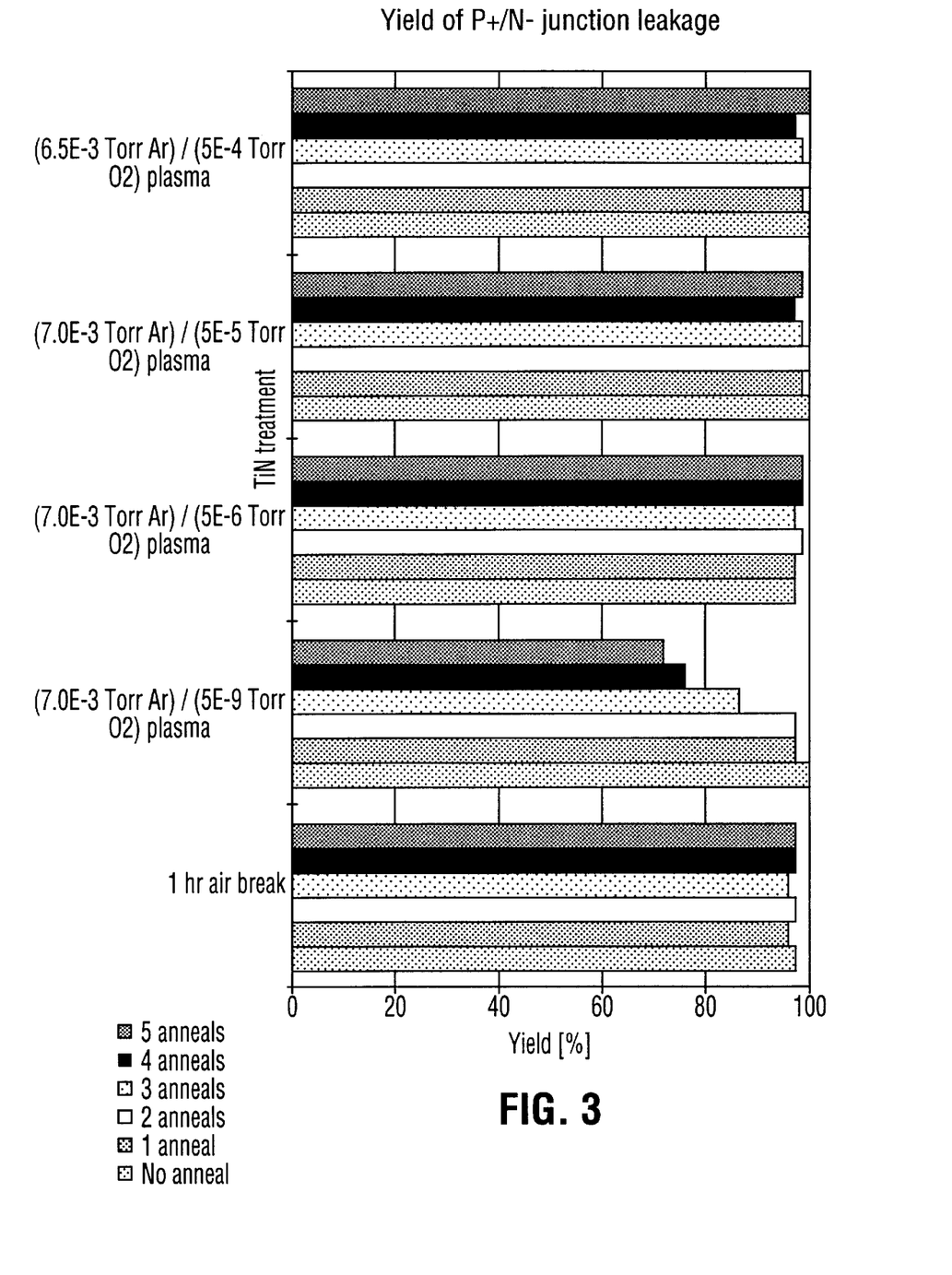
FIG. 3 is comparison chart showing the yield of $P^+/N^-$ junction leakage for different partial pressures of oxygen and using the air break technique of the prior art.
Figure 4:
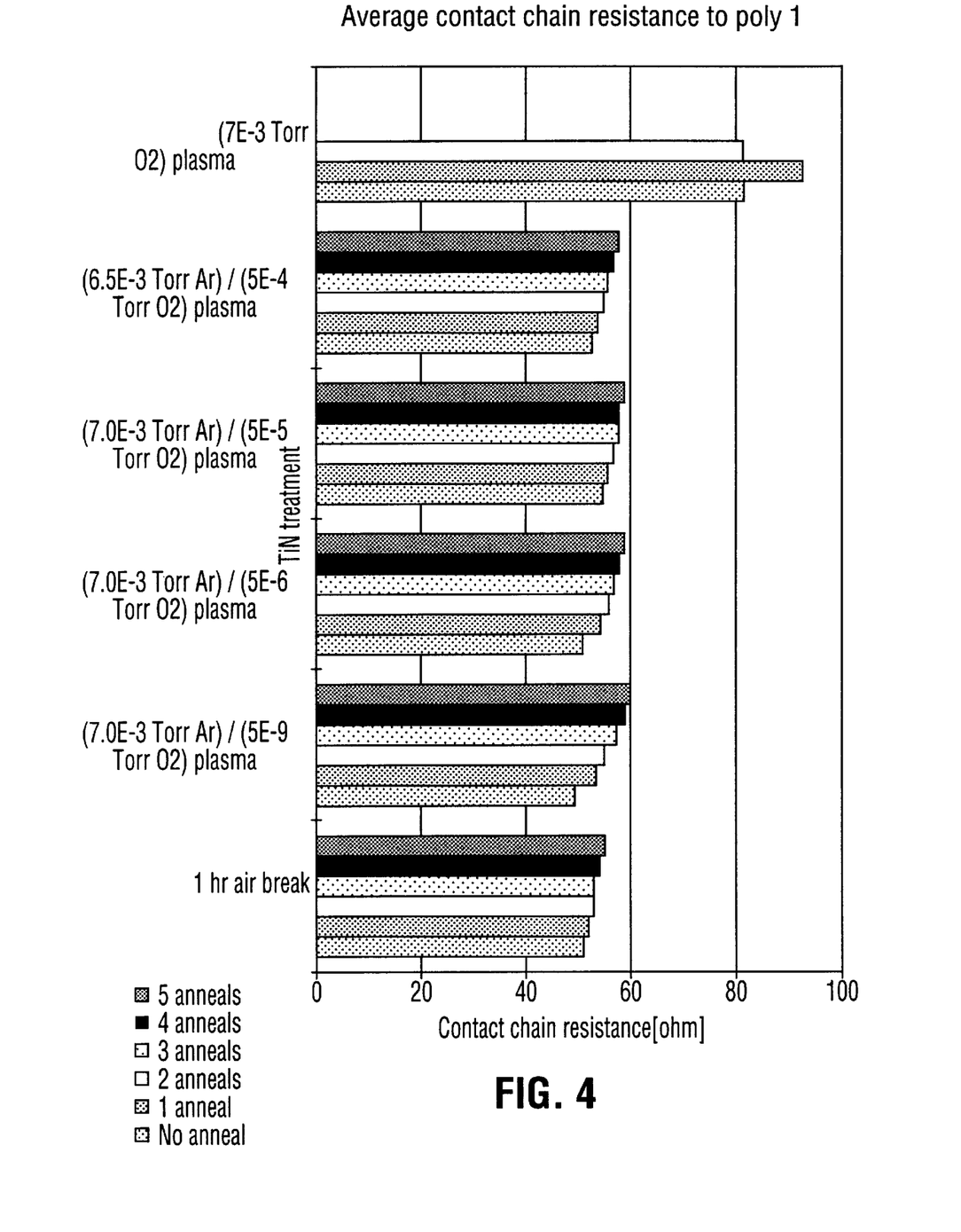
FIG. 4 is comparison chart showing the average contact chain resistance to polycrystalline silicon (poly) 1 for different partial pressures of oxygen and using the air break technique of the prior art.
Figure 5:
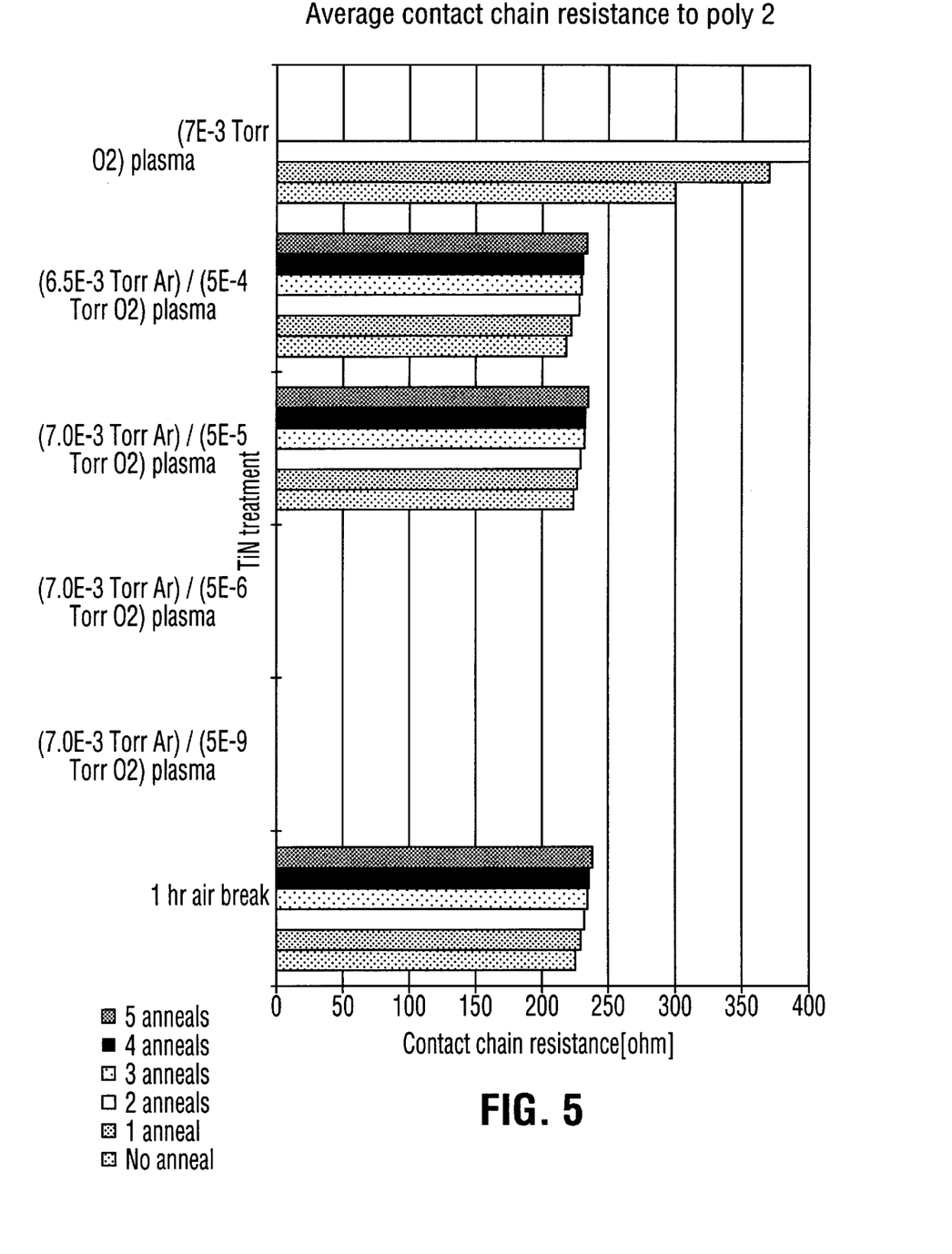
FIG. 5 is comparison chart showing the average contact chain resistance to poly 2 for different partial pressures of oxygen and using the air break technique of the prior art.
Figure 6:
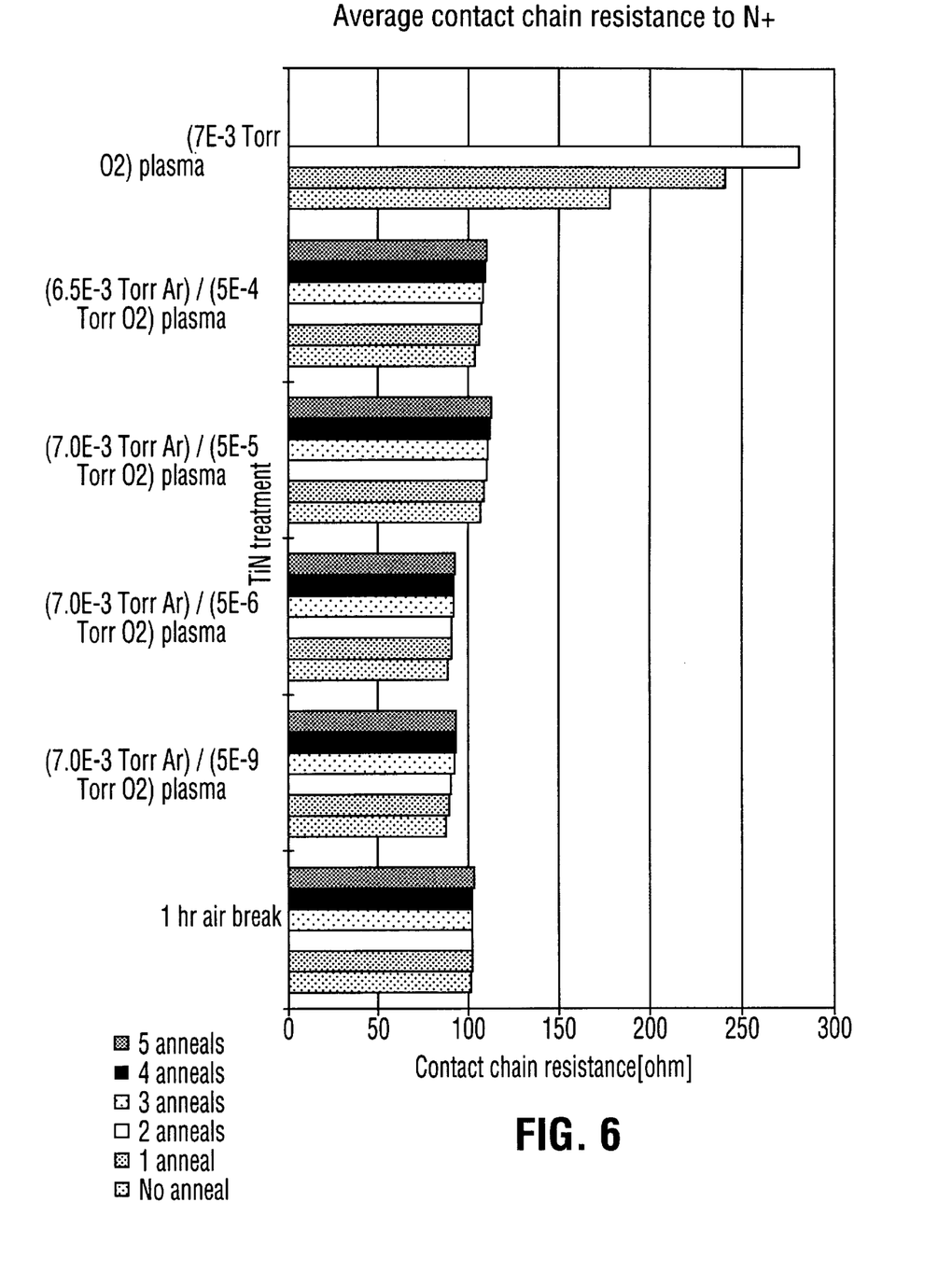
FIG. 6 is comparison chart showing the average contact chain resistance to $N^+$ material for different partial pressures of oxygen and using the air break technique of the prior art.
Figure 7:
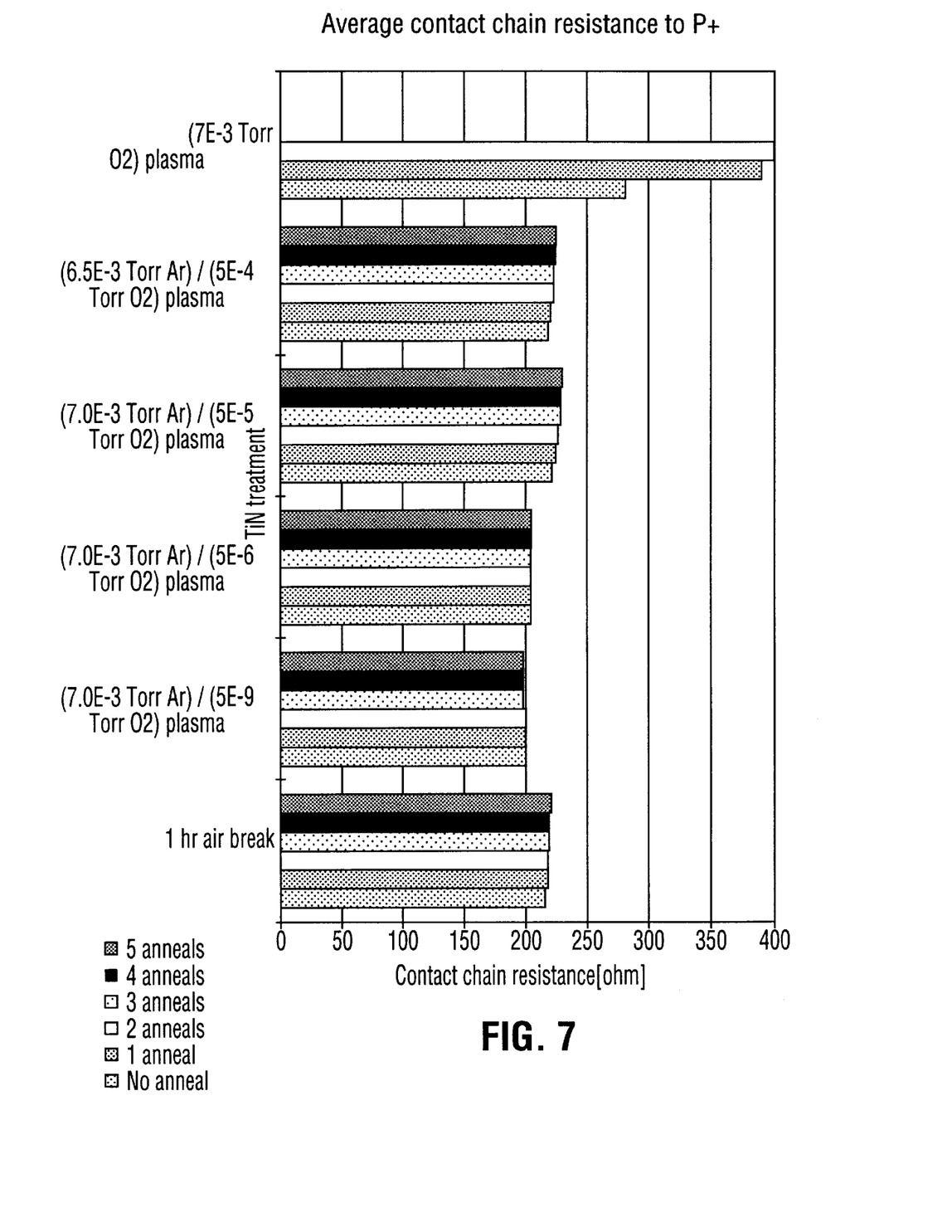
FIG. 7 is comparison chart showing the average contact chain resistance to $P^+$ material for different partial pressures of oxygen and using the air break technique of the prior art.
Figure 8:
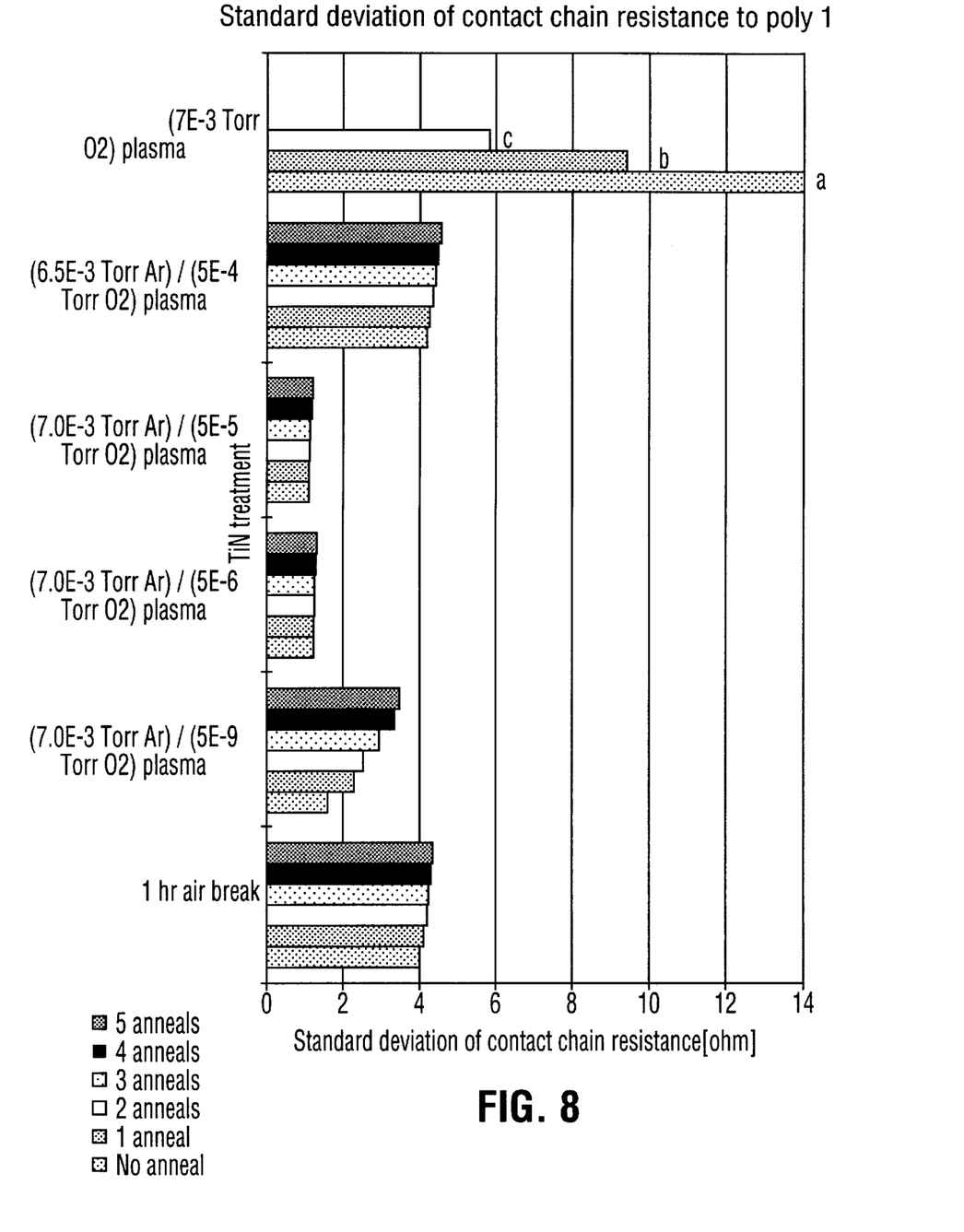
FIG. 8 is comparison chart showing the standard deviation of contact chain resistance to poly-1 for different partial pressures of oxygen and using the air break technique of the prior art.
Figure 9:
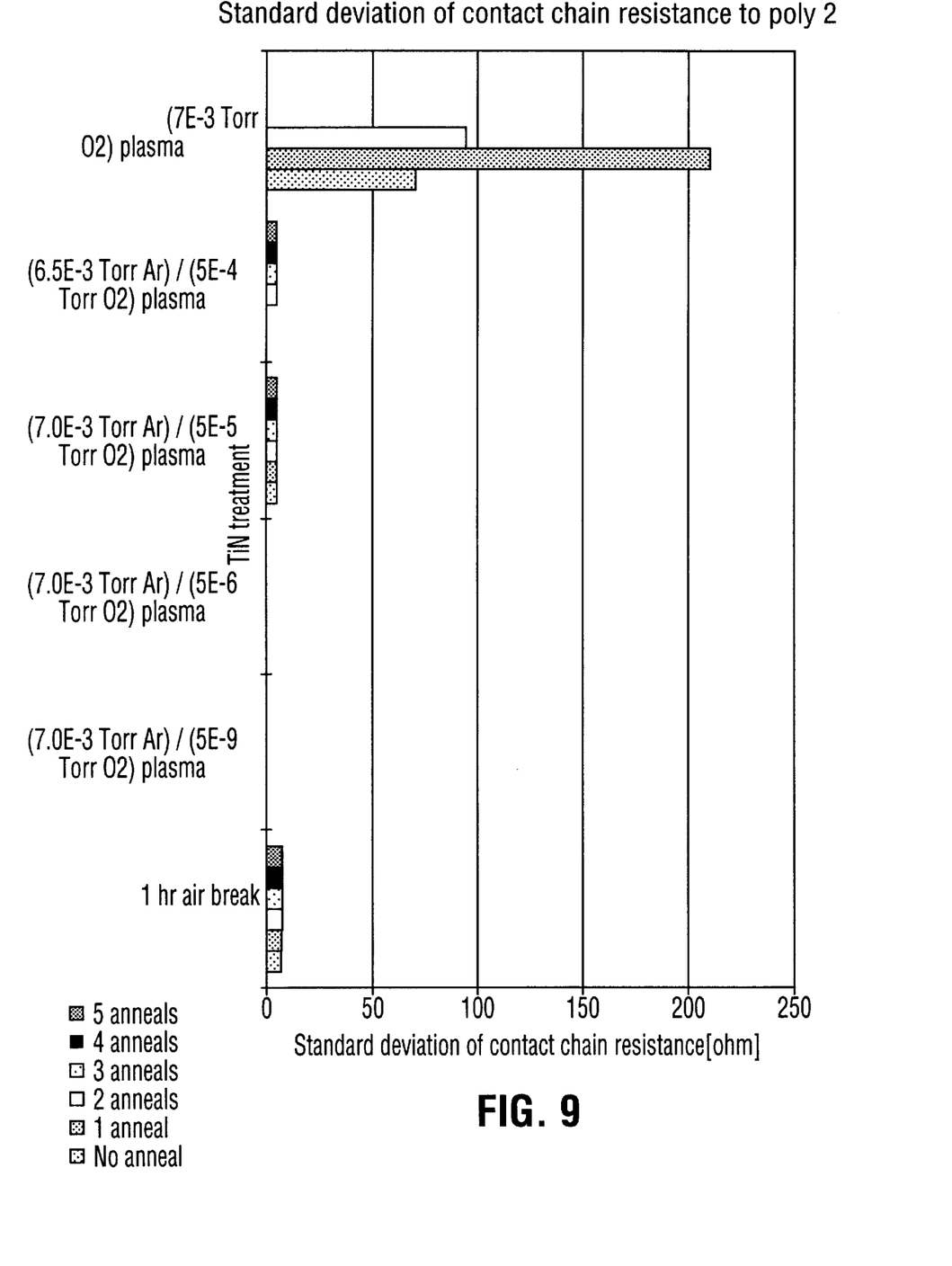
FIG. 9 is comparison chart showing the standard deviation of contact chain resistance to poly-2 for different partial pressures of oxygen and using the air break technique of the prior art.
Figure 10:
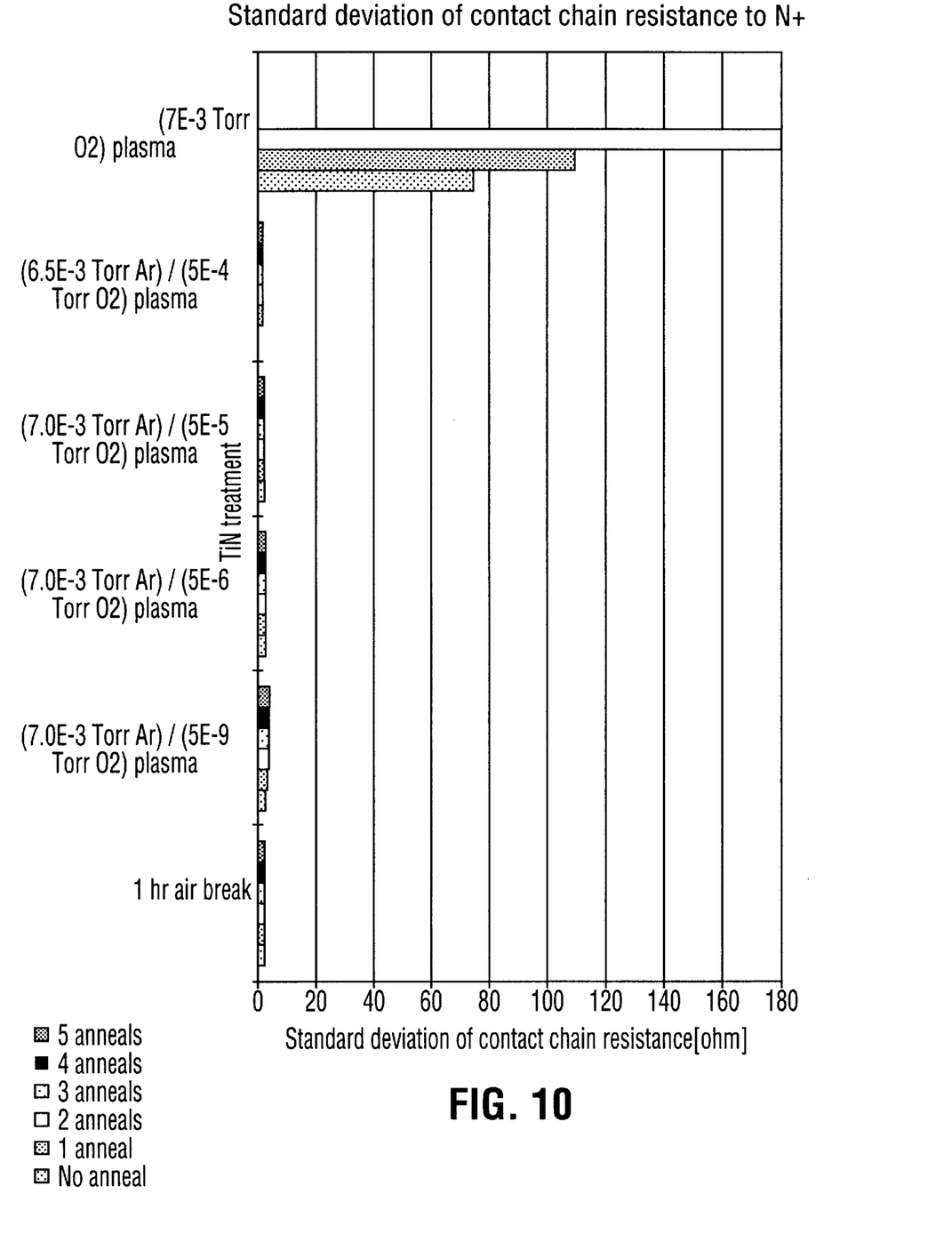
FIG. 10 is comparison chart showing the standard deviation of contact chain resistance to $N^+$ material for different partial pressures of oxygen and using the air break technique of the prior art.
Figure 11:
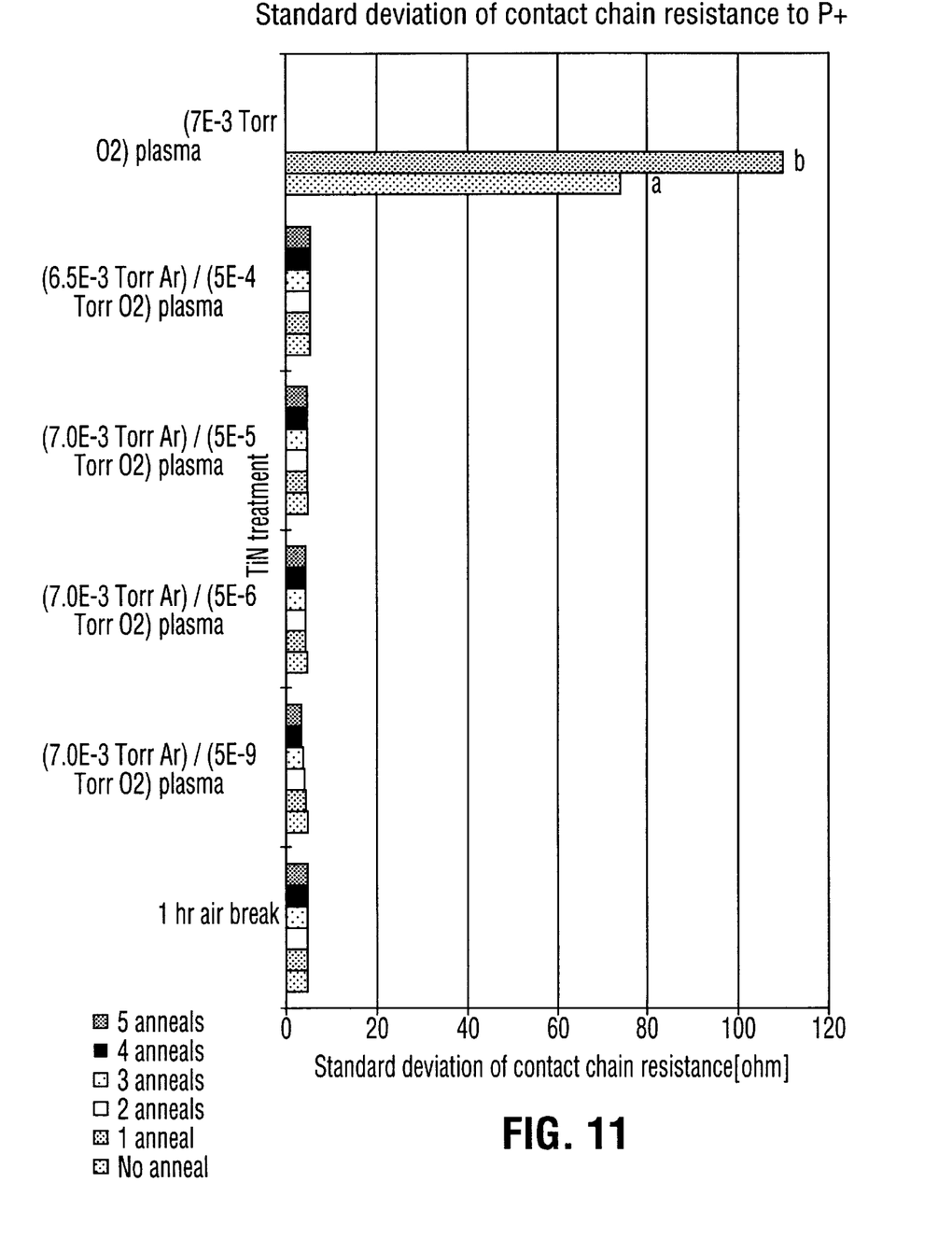
FIG. 11 is comparison chart showing the standard deviation of contact chain resistance to $P^+$ material for different partial pressures of oxygen and using the air break technique of the prior art.

Various alternative embodiments are possible without departing from the scope of the invention. The partial pressure of $O_2$ can be extended below the $10^{-6}$ Torr region to minimize the hazards associated with the cryopumps. The absolute lower limit can be determined by routine experiment depending on the acceptable performance in any given situation. FIG. 2, for example, shows a dramatic difference between $5\times10^{-6}$ and $5\times10^{-9}$ Torr partial pressure of oxygen.

As discussed above, $O_2$ gas could also be replaced by another oxygen-containing gas, such as $H_2O$ and $CO_2$. The dilution gas, Ar, could be also replaced by another inert gas.

The plasma parameters can be extended beyond the analyzed region. In particular, the cooling of the wafer during the plasma treatment could be replaced by a wafer heating to moderate temperatures, let say less than 450° C.

The plasma treatment can also be performed in the reverse order; i.e. to the Al alloy layer prior the deposition of the TiN layer (then used as an Anti-Reflective Coating, ARC).

When performed in a cluster tool, this "in-situ" oxidation permits an advanced metallization sequence to be performed at high throughput, without any air break and at very low cost.

The cryopumps could be replaced by alternate pumps (turbopumps, getter pumps). The Magnetically enhanced RF plasma could be replaced by an Inductively Coupled Plasma, by a downstream plasma or by any other means to generate a cold plasma with the gas containing oxygen atoms. The plasma treatment station could be separate from the process module and could be integrated into the transfer module, for example.

The TiN could be replaced by other popular nitrides of noble and refractory metals; i.e. tantalum nitride, tungsten nitride, molybdenum nitride.

We claim:

1. A method of manufacturing a semiconductor device which includes an interface between a metal layer and a barrier layer of a nitride of a refractory metal, comprising the steps of:

a) completely depositing the barrier layer onto a wafer at high temperature;

b) cooling the barrier layer;

c) subsequently subjecting the barrier layer to a mixture of oxygen or an oxygen-containing gas and an inert gas in the presence of a plasma wherein the partial pressure of oxygen is between about $5\times10^{-4}$ Torr and $5\times10^{-6}$ Torr for a time sufficient to oxidize the surface of the barrier layer;

d) removing said oxygen-containing gas; and e) depositing said metal layer onto said oxidized surface without subjecting said wafer to an air break.

2. A method as claimed in claim 1, further comprising the step of cooling the wafer to about room temperature prior to subjecting it to step b.

3. A method as claimed in claim 1, wherein the oxygen-containing gas is pure oxygen.

4. A method as claimed in claim 1, wherein the inert gas is argon.

5. A method as claimed in claim 1, wherein the metal is aluminum or an aluminum alloy and the barrier layer is titanium nitride.

6. A method as claimed in claim 1, wherein the partial pressure of the oxygen-containing gas is about $5\times10^{-5}$ Torr.

7. A method as claimed in claim 1, wherein the plasma is a magnetically enhanced plasma.

8. A method as claimed in claim 1, wherein the plasma is struck for a duration of about 60 seconds at a power level of about 250 W.

\* \* \* \* \*